United States Patent [19]

Nourry et al.

[11] Patent Number: 4,884,074

[45] Date of Patent: Nov. 28, 1989

[54] METHOD AND APPARATUS FOR ENCODING AND DECODING BINARY INFORMATION

[75] Inventors: Patrick Nourry, Echirolles; Jacques Husser, Eybens; Pierre-Yves Thoulon, Grenoble, all of France

[73] Assignee: Hewlett-Packard Company, Palo Alto, Calif.

[21] Appl. No.: 90,499

[22] Filed: Aug. 28, 1987

[30] Foreign Application Priority Data

Oct. 15, 1986 [FR] France ................... 8614572

[51] Int. Cl.⁴ ............................. H03M 5/12
[52] U.S. Cl. ........................ 341/70; 341/68
[58] Field of Search .................. 360/39–44; 340/347 D D; 341/50, 55, 56, 60, 68, 70, 71, 72

[56] References Cited

U.S. PATENT DOCUMENTS

| | | | |
|---|---|---|---|
| 3,795,903 | 3/1974 | Lindsey | 360/42 |
| 4,079,251 | 3/1978 | Osann, Jr. | 250/237 G X |
| 4,080,572 | 3/1978 | Hastings et al. | 375/95 |
| 4,185,273 | 1/1980 | Gowan | 340/347 D D |
| 4,355,423 | 10/1982 | Theall | 455/608 |
| 4,417,320 | 11/1983 | Ei | 364/900 |
| 4,443,787 | 4/1984 | Denk et al. | 340/347 P |
| 4,449,119 | 5/1984 | Hanna et al. | 340/347 D D |

FOREIGN PATENT DOCUMENTS 2139051A 10/1984 United Kingdom .

OTHER PUBLICATIONS

Norton, Drop Your Costs, But Not Your Bits With A Manchester-Data Decoder, Electronic Design, 19 Jul. 1979, pp. 110–116.

Primary Examiner—William M. Shoop, Jr.
Assistant Examiner—Brian K. Young

[57] ABSTRACT

A method for encoding and decoding successive information trains serially coded wherein each information bit is transmitted during a determined time interval, at least one level change appearing for each bit during this time interval, wherein, during the encoding, each information train is preceded by a heading having a time duration of two determined time intervals during which a code violation is carried out so that, during at least one time interval, no transition appears and wherein, while decoding, said violation is detected for finding the heading.

1 Claim, 4 Drawing Sheets

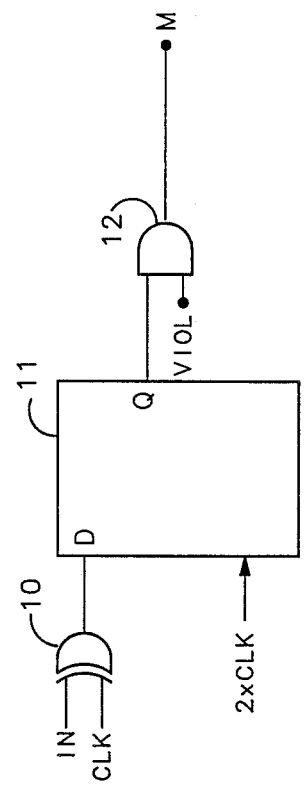
FIG 1
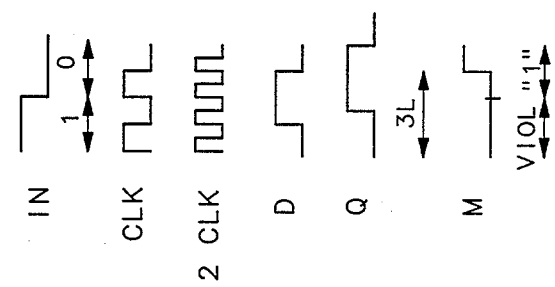
FIG 2A
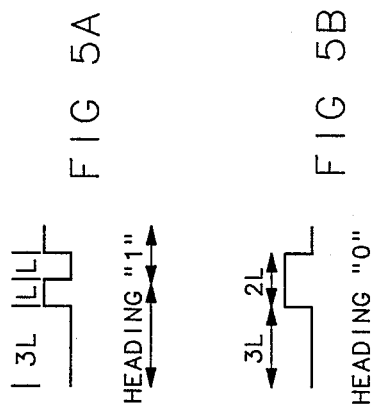
FIG 2B
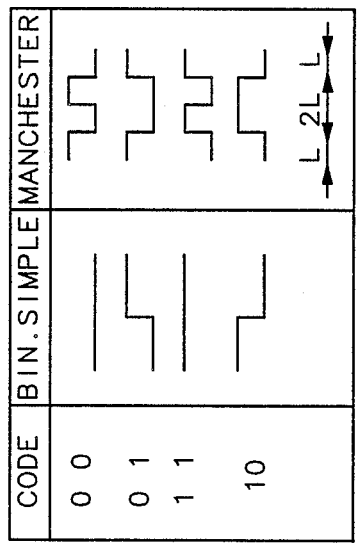
FIG 5A
FIG 5B

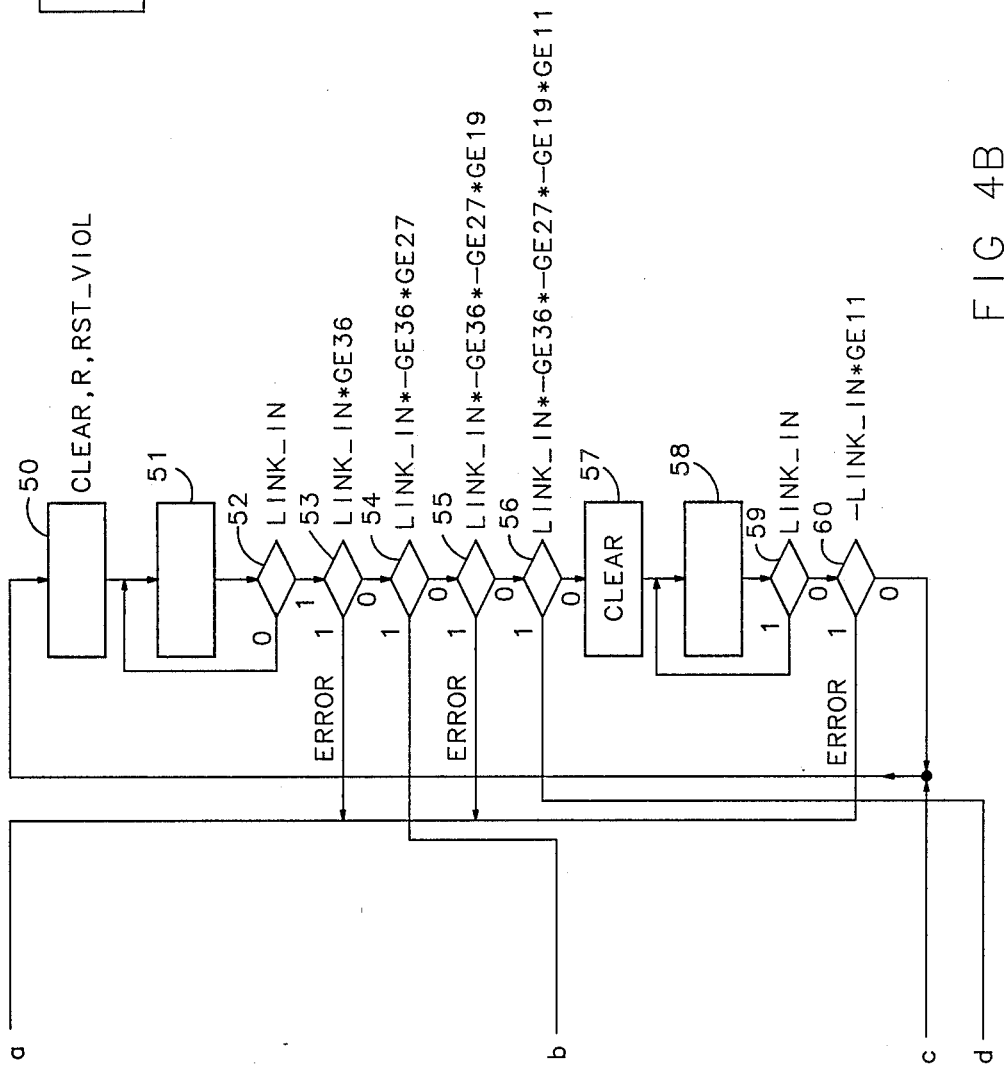

METHOD AND APPARATUS FOR ENCODING AND DECODING BINARY INFORMATION

FIELD OF THE INVENTION

This invention relates to a method for encoding and decoding serially transmitted binary information. More specifically, the invention relates to coding methods wherein each information bit is transmitted during a given constant time interval and wherein, during each time interval corresponding to one bit ("0" or "1"), at least one level transition is produced.

During the serial transmission of information between an emitting device and a receiving device, it is important to recognize the beginning of each information train in order to synchronize and identify the information elements. Toward this purpose, each transmitted information train is preceded by a characteristic heading which has to be recognized by the receiver which has to differentiate this heading from any possible succession of normal information. Among the various process already used, one of the simplest consists in transmitting a succession of bits having a predetermined level, this succession being longer than any possible identical succession of bits in an information train. One inconvenience of this simple method is that a large number of bits, and therefore, of time intervals, is used by the heading to the detriment of the information transfer.

SUMMARY OF THE INVENTION

Therefore, an object of the invention is to provide a method permitting, for the above referred code type, to provide a characteristic heading by using only two time intervals, each corresponding to one bit.

Another object of the invention is to provide an apparatus for implementing this method.

Another object of the invention is to provide such a method and apparatus particularly adapted to encode and decode information transmitted according to the code commonly known as Manchester.

For attaining those objects, the invention provides for a method for encoding and decoding successive serially coded information trains wherein each information bit is transmitted during a determined time interval, at least one level transition occurring for each bit during this time interval, wherein, during the encoding, each information train is preceded by a heading having a time duration of two determined time intervals during which a code violation is carried out so that, during at least one time interval, no transition appears and wherein, while decoding, said violation is detected for finding the heading.

More particularly, the invention provides a method for encoding and decoding successive information trains coded according to the Manchester code, that is a serial code in which each information bit is transmitted as the succession during a determined time interval (2L) of a low level and a high level for a "1" and the succession during the same time interval of a high level and a low level for a "0," wherein, during the coding, each information train is preceded by a heading having a duration of two determined time intervals (4L) during which a code violation is carried out so that, during a duration longer than a determined time interval, the coded signal is at the same level, and wherein, at the decoding, this longer time duration is detected for finding said heading. Said violation can be comprised of a low level during a first time interval followed with a Manchester "1" during the following time interval, whereby said coded signal is at the low level during at least one and a half time interval (3L).

BRIEF DESCRIPTION OF THE DRAWINGS

Those and other objects, features and advantages of the invention will be explained in greater detail in the following description of a preferred embodiment made in connection with the attached drawings wherein:

FIG. 1 is a table showing the correspondence between a succession of two bits in a normal binary code and in a Manchester code;

FIG. 2A shows a Manchester encoder;

FIG. 2B shows signals at various points of the circuit of FIG. 2A;

FIGS. 4A to 4C is a state diagram indicating the logic implemented by the decoder of FIG. 3; and FIGS. 5A and 5B show Manchester signals "1" and "0," respectively, after a heading according to the invention.

DESCRIPTION OF A PREFERRED EMBODIMENT

Figure 3:
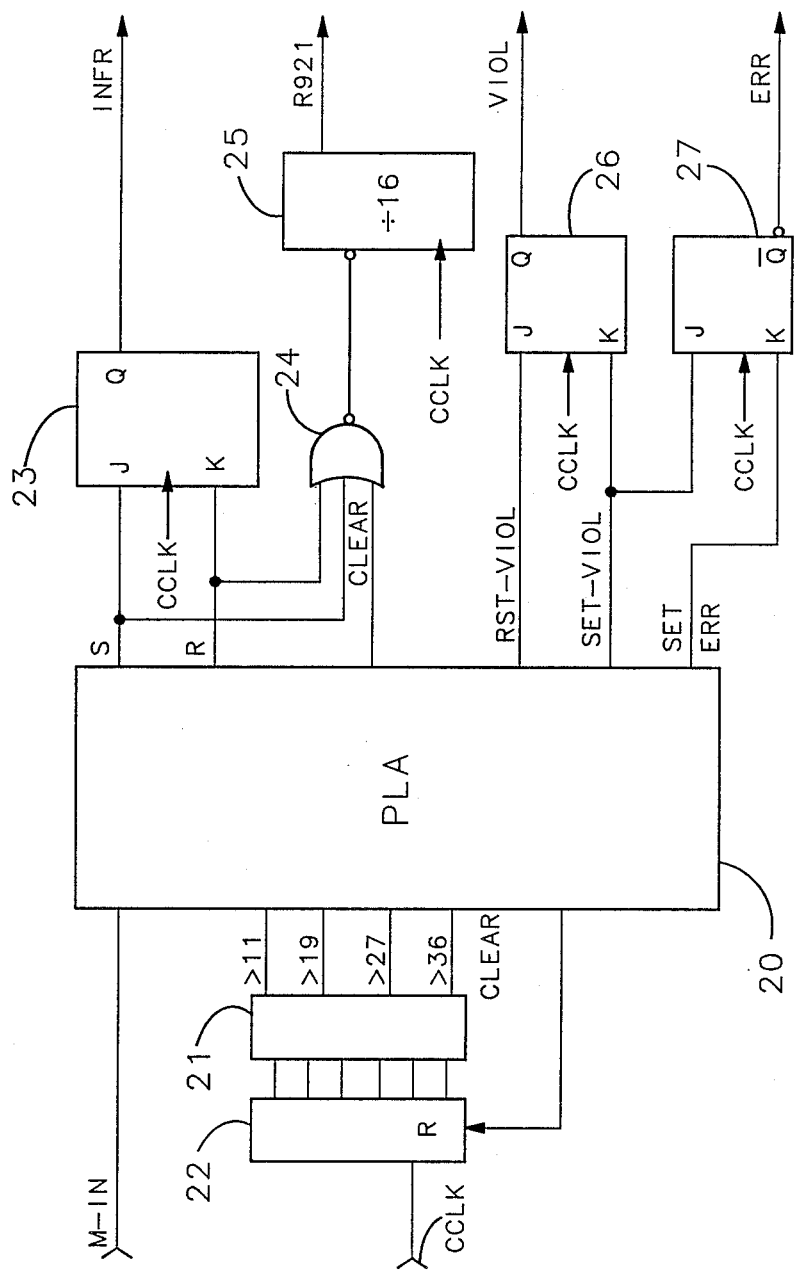
FIG. 3 shows a receiver-decoder according to the invention.

Although the invention generally applies to any encoding method wherein each bit is transmitted under the form of a constant duration signal presenting at least one transition of its electric level, that is to active coding or clock transmission coding, the invention will be disclosed here by way of an exemplary embodiment of simplicity in connection with a specific active coding, that is the Manchester code.

The Manchester coding convention is shown on the table of FIG. 1. Each bit is transmitted during a determined time interval 2L. A "0" is coded as the succession of a high level signal having a time duration L and a low level signal having a time duration L. Conversely, a "1" is transmitted under the form of the succession of a low signal of time duration L followed by a high signal of time duration L. The table of FIG. 1 shows signals that can be obtained of any two-bit succession in case of a normal binary coding, where each bit is transmitted as a low level signal if this bit is a "0" or as a high level if this bit is a "1," and in case of a Manchester code. It will be noted that, in the case of a Manchester code, the maximum time duration during one which one can obtain a signal having a given level is 2L, where one successively sends distinct bits (a "0" and a "1" or a "1" and a "0"). In case one transmits a succession of identical bits, the level remains constant during a maximum time duration of half a full signal time interval, that is L.

The basic idea of the instant invention is to violate this coding during at least one time interval for permitting in a transmitted code a time interval with a signal at a constant value during a duration larger than 2L.

FIG. 2A shows a simple conventional Manchester encoder to which a violation means according to the invention has been associated. This encoder mainly comprises an Exclusive-OR gate 10 which receives on a first input a signal IN corresponding to a succession of bits encoded according to a normal binary coding and on its second input a clock signal CLK, the period of which is equal to the duration 2L of a bit of a signal IN. Thus, at the output of the exclusive-OR gate 10, a signal D corresponding to the succession of the input signals coded according to a Manchester coding is obtained. FIG. 2B shows the signals IN, CLK and D in case the signal IN comprises the succession of a "1" and a "0."

The output of gate 10 is applied to the input D of a D flip-flop 11 which receives on its clock input a signal CCLK at a frequency double to the signal CLK formerly mentioned. This permits obtaining at the output Q of the flip-flop a signal delayed by a time duration L/2 with respect to the input signal D. Thus, the inconveniences associated to possible slight phase lags between the signals IN and CLK (short spurious transitions from "1" to "0" at the neighborhood of the transitions of the signal CLK) are avoided. The output Q is the normal output of a Manchester encoder. According to the invention, instead emitting directly this output signal, this one is transmitted through a logic circuit which can be simply shown as an AND gate 12, the first input of which is connected to the output Q and the second input of which is connected to a violation signal VIOL, this second input being an inverted input.

For providing a heading signal according to the invention, one first applies during a first time interval the signal VIOL whereby, as also shown in FIG. 2B, one obtains during this time interval a low level signal irregardless of the bit IN present at this moment, then one applies to the input IN a "1." Therefore, one obtains the signal M shown in FIG. 2B wherein, during a time duration 3L, the signal remains at a low level. If the applications of the signal VIOL follows a "0," the duration of the low level is 4L and if it follows a "1," the duration of the low level signal is 3L. FIG. 3 shows an example of a decoding circuit for recognizing the specific Manchester code violation formerly disclosed. However, it is clear that other types of violation could be provided, as long as there exists a duration longer than a normal duration of the initial code during which a constant level (high or low) is maintained.

The circuit of FIG. 3, further to the simple recognizing function above disclosed, permits providing specific indication as regards the detection, of a violation, the occurrence of encoding errors, and also permits synchronizing the phase of the receiving clock.

One of the elements of FIG. 3 is a logic circuit or sequencer which can be implemented in various ways, by means of wired circuits, pre-diffused circuits, or programmable logic arrays (PLA). This latter element is shown in FIG. 3, simply as a block 20 and the functions implemented by this block are shown in the state diagram of FIG. 4.

In the circuit of FIG. 3, the programmable logic array 20 receives as an input the signal M-IN from the output M of gate 12 shown in FIG. 2A through a suitable link, for example a two wire link. Classically, the signal M-IN can be processed by a shaping circuit comprising various flip-flops. Another input of the circuit 20 is the output of a decoder 21 receiving the output of the counting circuit 22. The counting circuit receives a clock signal CCLK at a frequency corresponding to sixteen times the frequency corresponding to one bit interval, that is the duration 2L aforementioned. Additionally, the counting circuit is reset by a CLEAR signal provided by the circuit 20 in a way to be explained in connection with FIG. 4. The decoding circuit 21 comprises four outputs indicated as: greater than 11, greater than 19, greater than 27 and greater than 36. For understanding the following description, it will be noted that the length L corresponds to 8 counting pulses, the duration 2L to 16 counting pulses, the duration 3L to 24 counting pulses and the duration 4L to 32 counting pulses.

The circuit 20 provides output signals S, R, CLEAR, RST-VIOL, SET-VIOL and SET-ERR. The signal S corresponds to the indication that the detected Manchester code corresponds to a "1," the signal R to the indication that the detected Manchester code corresponds to a "0," the CLEAR signal is a reset signal applied as above indicated to the counter 22, the RST-VIOL signal is a reset signal of a violation indication, the SET-VIOL signal is a signal of violation indication and the SET-ERR signal is a signal of error indication.

The signals S and R are applied to the inputs J and K of a JK flip-flop 23, the output of which provides a signal INFR corresponding to the succession of decoded Manchester information.

The signals S, R and CLEAR are applied to a NOR gate 24 the inverted output of which is applied to an input of a 16-divider 25 for reconstituting a phase locking signal of the reception clock on the frequency F=CCLK/16.

The signals RST-VIOL and SET-VIOL are applied to the inputs J and K of the JK flip-flop which outputs a signal VIOL indicating a violation; and the signals SET-VIOL and SET-ERR are applied to a JK flip-flop 27 which provides on its inverted output Q' an error signal ERR. Each of these JK flip-flops, together with the divider 25, also receives the clock signal CCKL.

FIG. 4 shows a state diagram of the functions implemented by the PLA 20. In this diagram, each rectangle indicates a state and each rhomb indicates an interrogation block.

The term LINK-IN appearing in front of each interrogation block designates an interrogation on the state of the input signal M-IN, that is an examination of the fact that this signal is at a high (1) or low (0) level. The abbreviation GE followed with a number indicates that it is examined whether the input signal is higher than this number. The symbol -GE followed with a number indicates that it is examined whether the input signal is lower than this number.

In this FIG. 4, the four hatched blocks correspond to the main states of the system: error (block 30), violation (block 37), Manchester code "1" (block 48) and Manchester code "0" (block 50).

INITIAL STATE

At an initial state shown by the state block 30, before the operation of the system, that is before a correct signal is transmitted or at the beginning of the detection, the system is at the state SET-ERR, that is error, CLEAR, that is a reset signal is sent to the counter 22, R, that is the signal R is high and RST-VIOL, that is the violation signal is 0.

From this initial state to which the system will come back, as explained hereinafter, each time an error appears in the code, one searches for the first useful signal heading, that is the first violation.

VIOLATION SEARCH

As seen above, a violation appears as a high level followed with a time interval equal to 3L or 4L at a low level, that is one searches for a count higher than 19 (2L corresponds to 16) and lower than 36 (4L corresponds to 32). Toward this purpose, in the interrogation block 31, one waits for the first high level and the counter 22 is reset at the block 32 (CLEAR) as long as the signal is at a high level. As soon as the first low level detected by the interrogation block 33 appears, the counter begins to count (block 34) until a high level appears (state change detected by the interrogation block 35). Then the interrogation block 36 checks whether the time duration of the low level has corresponded to a duration comprised between 19 and 36 counts. If yes, one passes to the state 37 (hatched block) which is a state where are produced the signals CLEAR (reset) and SET-VIOL (set a violation signal).

From this state 37, one searches whether the immediately following coded signal corresponds to a "1" or a "0" Manchester.

SEARCH OF A MANCHESTER "1" AFTER A VIOLATION

Figure 4A:
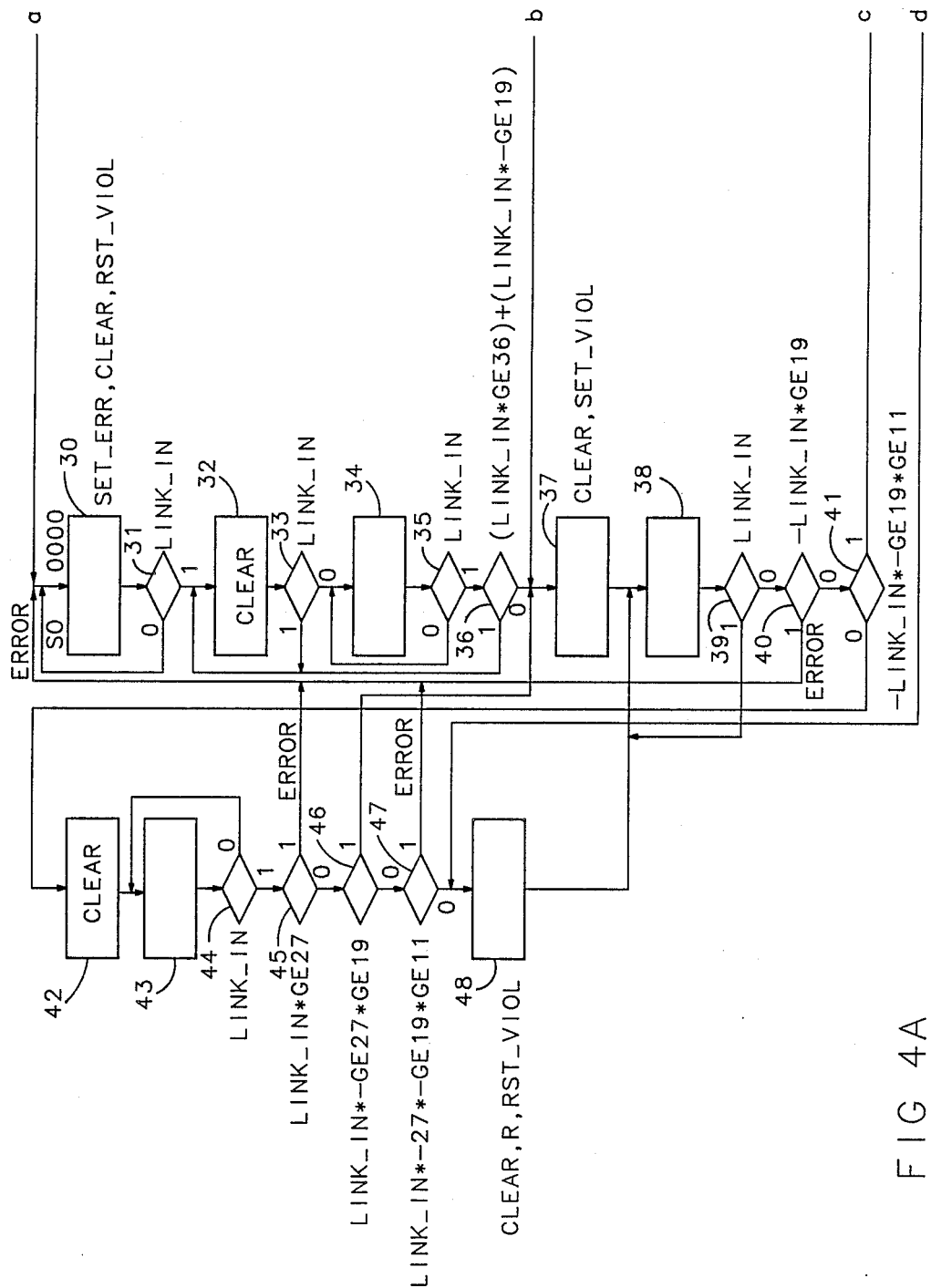

After a violation, a Manchester "1" is characterized, as shown in FIG. 4A, by the presence of the long time duration 3L or 4L at low level followed with a duration of one interval L at a high level followed with a duration of one interval L at a low level. Thus, it will be searched whether there is a high level during a count lower than 11 followed with a low level during a counter lower than 11.

Blocks 38 and 39 show a count as long as the signal is at a high level; during the next switching at low level, interrogation block 40 determines whether the time duration of the signal is lower than 19 counts. If no, this corresponds to an error state and the system comes back to block 30. Then, block 41 determines if the count duration is lower than 11 counts or comprised between 11 and 19 counts. If the duration is shorter than 11 counts, the counter is reset at block 42 and the duration of the following low level is analyzed in blocks 43 and 44. If this duration is shorter than 11, as determined by block 47, a Manchester "1" is decoded and a state S is provided in block 48 simultaneously with a signal CLEAR and a signal RST-VIOL. Block 45 checks whether the state 0 has a duration longer than 27 counts in which case an error is determined and the system comes back to block 30; block 46 checks whether this count is comprised between 19 and 27 in which case a new heading is detected and the system comes back to the violation state indicated in block 37.

SEARCH OF A MANCHESTER "0" AFTER A VIOLATION

Such a state is characterized, as shown in FIG. 5B, by a high level time duration equal to 2L (count greater than 11 and smaller than 19) after the detection of a low level time duration at least equal to 3L, characteristic of a heading.

Therefore, if block 41 indicates that a high level has been detected during a time duration comprised between 11 and 19 counts, a Manchester "0" has been detected and the system goes to state 50 where the signal R is provided, together with the signals CLEAR and RST-VIOL.

Then, from state S (detection of a Manchester "1"—block 48) or from state R (detection of a Manchester "0"—block 50) the next Manchester code is analyzed.

DETECTION OF THE CODE FOLLOWING A MANCHESTER "1"—(STATE S, BLOCK 48)

If the Manchester "1" is followed with another "1," a high state shorter than L (shorter than 11 counts) followed with a low state shorter than L (shorter than 11 counts) appears. This fact is detected as above disclosed by the succession of states and interrogations corresponding to blocks 38 to 47 and the system comes back to state 48.

If the "1" is followed with a Manchester "0," a high state having a time duration 2L (time duration comprised between 11 and 19 counts) appears. This is detected by the succession of blocks 38 to 41 and the system comes back to state 50.

DETECTION OF THE CODE FOLLOWING MANCHESTER "0"—(STATE R, BLOCK 50)

This analysis is carried out by the success of blocks 51 to 60.

In blocks 51 to 56, it is determined whether the low state after the high state having a duration 2L is in turn longer than 2L (greater than 11). In this case, a Manchester "1" has been detected and block 56 sends back to state 48.

Blocks 53 and 55 correspond to error detections (too long signals not normally existing) and the interrogation block 54 permits to detect whether a low state having a time duration comprised between 19 and 27 appears, in which case the system comes back to block 47: detections of a violation.

If block 56 has shown that the low state following the high state having a time duration 2L has a duration L (counter lower than 11), blocks 57 to 60 search whether the next high state has a duration equal to L (lower than 11). This state is determined by blocks 58 to 60. If this condition is satisfied, a Manchester "0" is detected and block 60 sends back to block 50. If this condition is satisfied, this means than an error state exists and the system comes back to the initial block 30.

Of course, the logic system shown in FIG. 4 for the PLA 20 of FIG. 3 constitutes only a particular example of a possible logic diagram and other logic diagrams could be provided for indicating that the received signal corresponds to a violation, an error, a Manchester "1" or a Manchester "0." FIG. 4 has been disclosed in detail only for showing that, by a logic diagram easily implementable to a simply programmable PLA, it is possible to implement the detection of a heading and an analysis of a succession of coded signals according to the Manchester code.

We claim:
1. A method for encoding and decoding successive information trains coded according to the Manchester code, that is a serial code in which each information bit is transmitted as the succession during a determined time interval of a first level and a second level for a "1" and the succession during the same time interval of a second level and a first level for a "0," wherein, during the encoding, each information train is preceded by a heading having a duration of two determined time intervals during which a code violation is carried out, characterized in that:
   during a duration longer than a determined time interval, the coded signal is at the same level, and wherein, at the decoding, this longer time duration is detected for finding said heading, said violation being comprised of a first level during a time interval followed with a Manchester "1" during the following time interval, whereby said coded signal is at the first level during at least one and a half time intervals.

* * * * *